US010770273B2

(12) United States Patent
Kim et al.

(10) Patent No.: US 10,770,273 B2
(45) Date of Patent: Sep. 8, 2020

(54) OES DEVICE, PLASMA PROCESSING APPARATUS INCLUDING THE SAME AND METHOD OF FABRICATING SEMICONDUCTOR DEVICE

(71) Applicants: Samsung Electronics Co., Ltd., Suwon-si (KR); Industry-Academic Cooperation Foundation, Yonsei University, Seoul (KR)

(72) Inventors: In-Joong Kim, Seoul (KR); Il Gu Yun, Seoul (KR)

(73) Assignees: SAMSUNG ELECTRONICS CO., LTD., Samsung-ro, Yeongtong-gu, Suwon-si, Gyeonggi-do (KR); INDUSTRY-ACADEMIC CORPERATION FOUNDATION, YONSEI UNIVERSITY, Yonsei-ro, Seodaemun-gu, Seoul (KR)

( * ) Notice: Subject to any disclaimer, the term of this patent is extended or adjusted under 35 U.S.C. 154(b) by 0 days.

(21) Appl. No.: 16/117,779

(22) Filed: Aug. 30, 2018

(65) Prior Publication Data

US 2019/0252164 A1 Aug. 15, 2019

(30) Foreign Application Priority Data

Feb. 9, 2018 (KR) .......................... 10-2018-0016378

(51) Int. Cl.
*H01L 21/66* (2006.01)
*H01J 37/32* (2006.01)
(Continued)

(52) U.S. Cl.
CPC ........ *H01J 37/32972* (2013.01); *G01N 21/68* (2013.01); *G01N 21/73* (2013.01);
(Continued)

(58) Field of Classification Search
CPC ...................................................... H01L 22/26
(Continued)

(56) References Cited

U.S. PATENT DOCUMENTS 6,547,458 B1 4/2003 Janos et al.
8,372,169 B2 * 2/2013 Tsangaris ................. C10K 1/20
48/120

(Continued)

FOREIGN PATENT DOCUMENTS

JP 05089996 4/1993
JP 05315095 11/1993
(Continued)

*Primary Examiner* — Jami Valentine Miller
(74) *Attorney, Agent, or Firm* — Muir Patent Law, PLLC

(57) ABSTRACT

A plasma processing apparatus is provided. The plasma processing apparatus includes a chamber configured to perform a plasma process on a wafer, a viewport configured to transmit plasma light generated in the chamber, a rotation module coupled to the viewport to be rotatable around a rotation axis, and an OES (Optical Emission Spectroscopy) device which is coupled to the rotation module and configured to receive the plasma light, wherein the rotation module includes a first surface facing the viewport and a second surface facing the OES device, wherein the first surface is configured to block a part of the plasma light, and includes a first opening through which an inside of the rotation module is configured to be exposed to a part of the plasma light, and wherein the second surface includes a second opening configured to be in light communication with the first opening.

18 Claims, 13 Drawing Sheets

(51) Int. Cl.
  *H01L 21/67* (2006.01)
  *G01N 21/73* (2006.01)
  *G01N 21/68* (2006.01)
(52) U.S. Cl.
  CPC ........ *H01L 21/67253* (2013.01); *H01L 22/26* (2013.01); *H01J 37/32449* (2013.01); *H01J 2237/2482* (2013.01); *H01J 2237/24507* (2013.01)
(58) Field of Classification Search
  USPC .......................................................... 438/7
  See application file for complete search history.

(56) References Cited

U.S. PATENT DOCUMENTS

| | | | |
|---|---|---|---|
| 8,416,509 | B2 | 4/2013 | Yi et al. |
| 9,091,595 | B2 | 7/2015 | Asakura et al. |
| 2012/0235036 | A1* | 9/2012 | Hatakeyama ...... G01N 23/2251 250/310 |
| 2013/0172691 | A1* | 7/2013 | Tran ....................... A61B 8/488 600/301 |

FOREIGN PATENT DOCUMENTS

| | | |
|---|---|---|
| JP | 10242120 | 9/1998 |
| JP | 2006310371 | 11/2006 |
| KR | 10-2012-0127350 | 11/2012 |
| KR | 10-1335011 | 12/2013 |
| KR | 10-1571928 | 11/2015 |

* cited by examiner

0°

90°

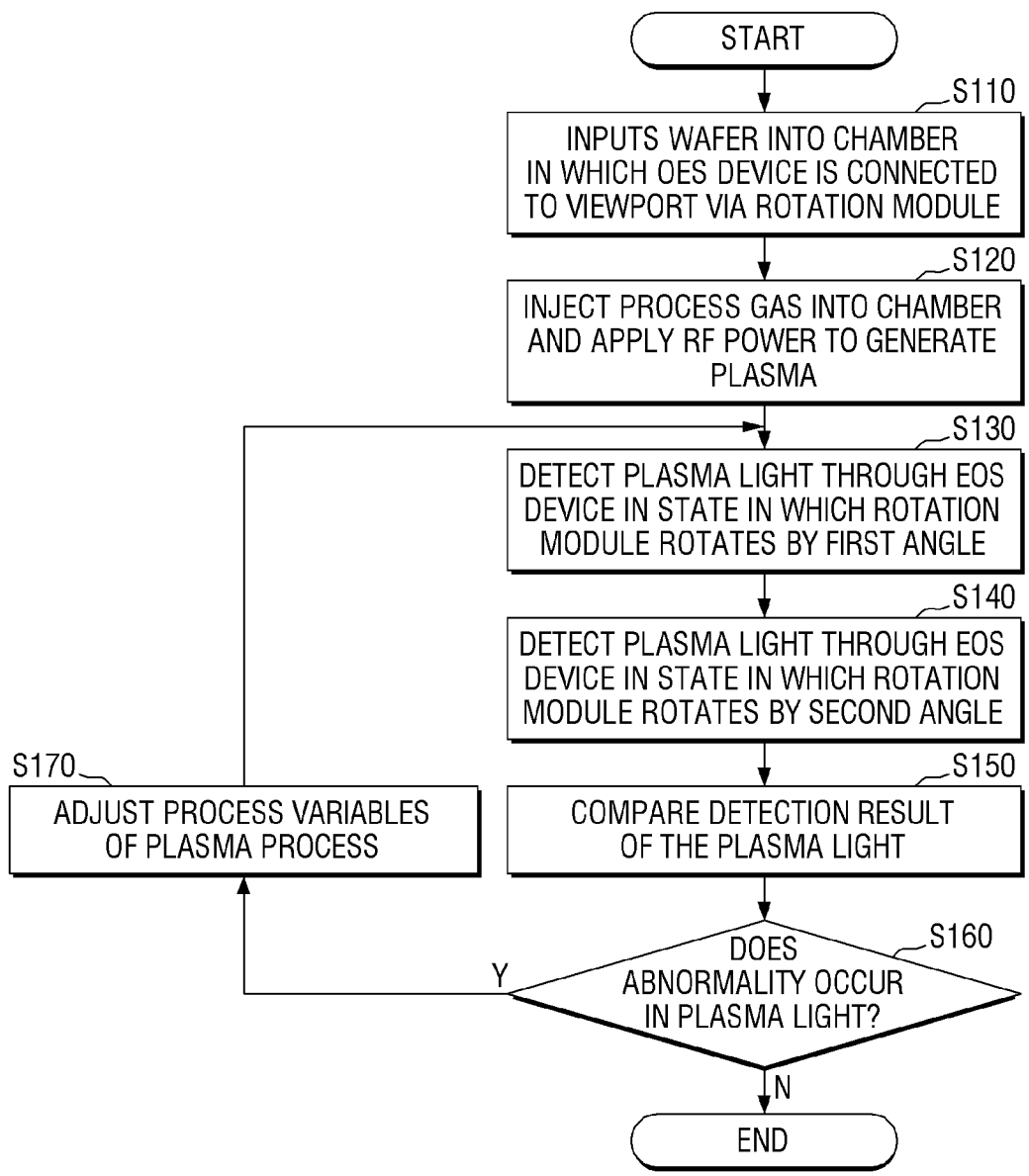

OES DEVICE, PLASMA PROCESSING APPARATUS INCLUDING THE SAME AND METHOD OF FABRICATING SEMICONDUCTOR DEVICE

This application claims priority under 35 U.S.C. § 119 to Korean Patent Application No. 10-2018-0016378 filed on Feb. 9, 2018 in the Korean Intellectual Property Office, the disclosure of which is incorporated herein by reference in its entirety.

BACKGROUND

1. Technical Field

The present disclosure relates to an OES (Optical Emission Spectroscopy) device, a plasma processing apparatus including the same, and a method of fabricating a semiconductor device.

2. Description of the Related Art

Recently, a system which accelerates desired chemical reaction (film formation, etching, etc.) using plasma has been widely used in the semiconductor device fabricating industry.

An OES (Optical Emission Spectroscopy) device is used for optically diagnosing the presence or absence of abnormalities in the plasma process. The OES device has an advantage that the uniformity of the plasma in the chamber can be determined from the outside of the chamber, without requiring insertion of a probe into the chamber.

SUMMARY

Exemplary embodiments of the present disclosure provide an OES device with improved detection performance of abnormality occurrence of a plasma process.

Exemplary embodiments of the present disclosure provide a plasma processing apparatus including an OES device with improved detection performance of abnormality (or out of specification) occurrence of the plasma process.

Exemplary embodiments of the present disclosure provide a method of fabricating a semiconductor device using improved OES analysis.

According to an exemplary embodiment of the present disclosure, there is provided a plasma processing apparatus, comprising a chamber configured to perform a plasma process on a wafer, a viewport configured to transmit plasma light generated in the chamber, a rotation module coupled to the viewport to be rotatable around a rotation axis, and an OES (Optical Emission Spectroscopy) device which is coupled to the rotation module and configured to receive the plasma light, wherein the rotation module includes a first surface facing the viewport and a second surface facing the OES device, wherein the first surface is configured to block a part of the plasma light, and includes a first opening through which an inside of the rotation module is configured to be exposed to a part of the plasma light, and wherein the second surface includes a second opening configured to be in light communication with the first opening.

According to an exemplary embodiment of the present disclosure, there is provided an OES (Optical Emission Spectroscopy) device, comprising a rotation module coupled to a viewport of a chamber, the rotation module configured to transmit plasma light generated in the chamber, the rotation module configured to be rotatable around a rotation axis, a light-receiving part coupled to the rotation module and configured to receive the plasma light, a spectroscope configured to separate the plasma light and analyzes intensities of corresponding wavelengths and an optical cable which connects the light-receiving part and the spectroscope, wherein the rotation module includes a first surface coupled to the viewport and a second surface coupled to the light-receiving part, wherein the first surface is configured to block a part of the plasma light, and includes a first opening through which an inside of the rotation module is configured to be exposed by the first blocking film, and wherein the second surface includes a second opening configured to be in light communication with the first opening.

According to an exemplary embodiment of the present disclosure, there is provided a method of fabricating a semiconductor device, comprising inputting a wafer into a chamber in which an OES (Optical Emission Spectroscopy) device is connected to a viewport through a rotation module, injecting a process gas into the chamber and applying RF power to generate a plasma, positioning the rotation module at a first angle to monitor the plasma in the chamber by using plasma light transmitted through the viewport, rotating the rotation module by a second angle to monitor the plasma in the chamber by using plasma light transmitted through the viewport, comparing monitoring result of the plasma at the first angle and the second angle to determine a plasma uniformity in the chamber, and adjusting process variables of the chamber, wherein the OES device includes the rotation module coupled to the viewport so as to be rotatable around a rotation axis, the rotation module including a first surface coupled to the viewport and a second surface coupled to a light-receiving part, the first surface including a first blocker which blocks a part of a plasma light, and a first opening through which an inside of the rotation module is exposed to a part of the plasma light, and the second surface including a second opening in light communication with the first opening.

Exemplary embodiments of the present disclosure are not limited to those mentioned above and another aspect which has not been mentioned can be clearly understood by those skilled in the art from the description below.

BRIEF DESCRIPTION OF THE DRAWINGS

The above and other exemplary embodiments and features of the present disclosure will become more apparent by describing in detail exemplary embodiments thereof with reference to the attached drawings, in which:

FIG. 3b is a top view illustrating the rotation module of FIG. 3a from a B direction shown in FIG. 3a;

FIG. 4a is a cross-sectional view taken along line A-A' of the rotation module of FIG. 3a;

FIG. 9 is a flowchart illustrating a method of fabricating a semiconductor device performed by a plasma processing apparatus according to some embodiments of the present disclosure.

DETAILED DESCRIPTION

Figure 1:
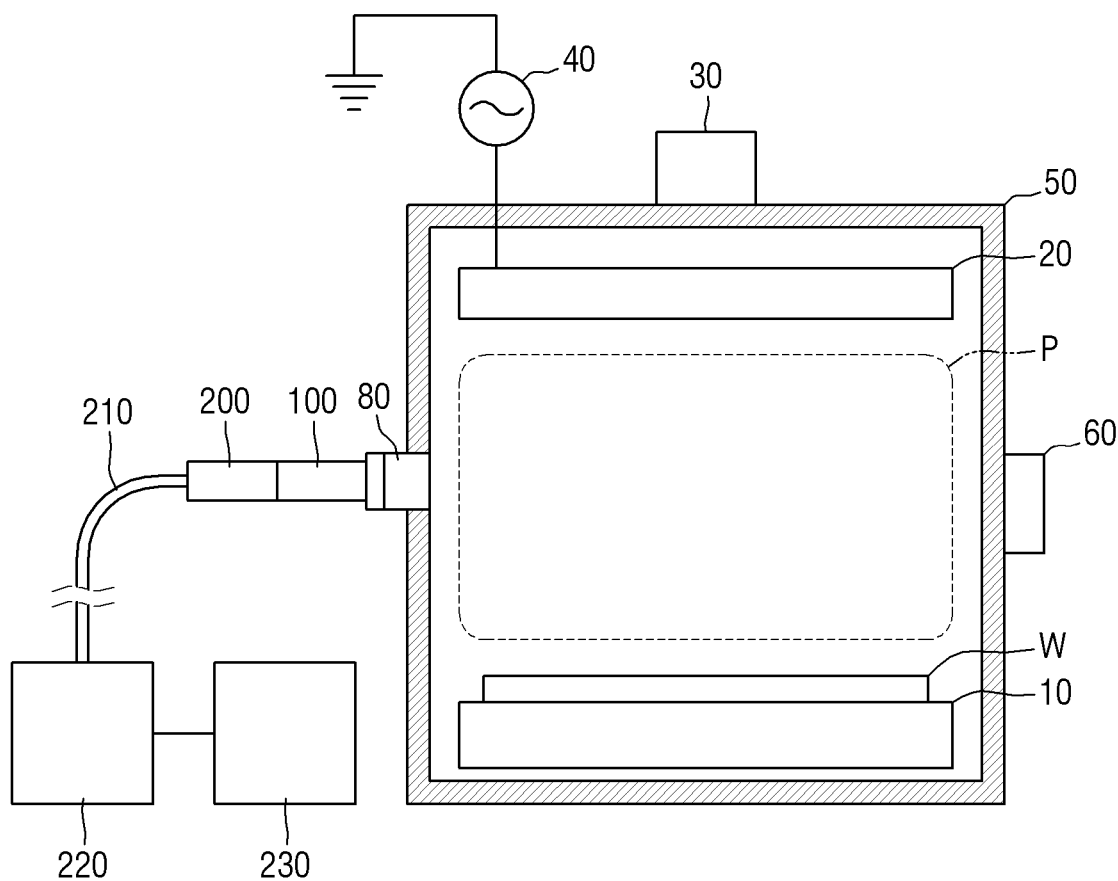
FIG. 1 is a diagram illustrating a plasma processing apparatus according to some embodiments of the present disclosure.

FIG. 1 is a view for explaining a plasma processing apparatus according to some embodiments of the present disclosure.

Referring to FIG. 1, a plasma processing apparatus according to some embodiments of the present disclosure may include an electrostatic chuck 10, a shower head 20, a gas supply port 30, an RF power supply 40, a chamber 50, a gas discharge port 60, a viewport 80, a rotation module 100, a light-receiving part 200, and the like.

The electrostatic chuck 10 may support a wafer W which is introduced into the chamber 50. The electrostatic chuck 10 may have, but is not limited to, a circular planar shape to support a circular wafer W. The electrostatic chuck 10 may fix the wafer W to an upper surface thereof by electrostatic force. In a plasma processing step using the plasma processing apparatus according to an embodiment of the present disclosure, the electrostatic chuck 10 may function as a lower electrode.

A shower head 20 may be placed over the electrostatic chuck 10 inside the chamber 50. The shower head 20 may supply a process gas, which is supplied through the gas supply port 30 in the plasma processing step, into the chamber 50. The shower head 20 may function as an upper electrode to which the RF power supply 40 is applied in the plasma processing step. Although it is not specifically illustrated, a plurality of openings may be formed on a first surface of the shower head 20 and the first surface may face the electrostatic chuck 10.

The chamber 50 may receive the process gas supplied from the gas supply port 30. In some embodiments of the present disclosure, the process gas may be a mixture of two or more gases.

Inside the chamber 50, a plasma P may be formed from the supplied process gas. The chamber 50 may include a space in which the plasma processing step of the wafer W is performed, using the formed plasma P. In some embodiments of the present disclosure, a deposition process, an etching process, and the like of the wafer W may be performed in the chamber 50, but the present disclosure is not limited thereto. The chamber 50 may discharge the process gas via the gas discharge port 60 after the execution of the plasma process is completed. The gas discharge port 60 may adjust the pressure in the chamber 50. For example, by controlling amount and/or speed of the discharge of the process gas through the gas discharge port 60, the pressure in the chamber 50 may be adjusted.

As illustrated in FIG. 1, the chamber 50 may operate in a CCP (Capacitively Coupled Plasma) manner, but it is not limited thereto. The chamber 50 may also operate in an (ICP Inductively Coupled Plasma) manner. For example, the plasma P in the chamber 50 may be generated and/or controlled with a CCP method or with an ICP method.

The RF power supply 40 supplies power for forming the plasma P in the chamber 50. For example, the RF power supply 40 may apply the RF power to the shower head 20. The RF power supply 40 may supply, for example, power in the form of a pulse modulated square wave to the shower head 20.

The RF power supply 40 may include an impedance matching circuit for minimizing the reflected power of an electric circuit formed between the shower head 20 and the electrostatic chuck 10.

The viewport 80 may be installed so that the inside of the chamber 50 can be monitored through the viewport 80. The viewport 80 may be connected to a rotation module 100 coupled to the light-receiving part 200 and may function as a passage for providing the state of plasma light in the chamber 50 to the light-receiving part 200.

The viewport 80 may include, for example, a transparent material such as glass or quartz, but is not limited thereto, and may include materials such as polycarbonate and acryl.

The rotation module 100 may be coupled to the viewport 80 and the light-receiving part 200. The rotation module 100 may provide a part of the plasma light from the chamber 50 provided through the viewport 80 to the light-receiving part 200, while revolving around a rotation axis. The operation of the rotation module 100 will be explained in more detail later.

The light-receiving part 200 may receive plasma light generated in the chamber 50. The plasma light provided to the light-receiving part 200 may be light which is left after being partially blocked by the rotation module 100, among the light transmitted to the viewport 80. Likewise, this will be explained below in more detail.

The optical cable 210 is connected to the light-receiving part 200, and may transfer the plasma light coming from the chamber 50 transmitted through the viewport 80 to a spectroscope 220. In some embodiments, the optical cable 210 may include a bundle of multiple optical fibers wrapped in fabric.

The rotation module 100, the light-receiving part 200 and the optical cable 210 connected to the viewport 80 may constitute an OES (Optical Emission Spectroscopy) device.

The spectroscope 220 may receive plasma light coming from the chamber 50 through the optical cable 210. The spectroscope 220 may analyze the light provided via the optical cable 210 and analyze the state of the plasma P in the chamber 50. For example, the spectroscope 220 may analyze the light coming from the plasma P and evaluate the state of the plasma P with the result of the analysis of the light. The spectroscope 220 may spectrally separate the plasma light coming from the chamber 50, for example, provided through the optical cable 210 in accordance with the wavelength, and may measure the intensity of light depending on the wavelength (e.g., intensities of corresponding wavelengths). For example, the spectroscope 220 may measure intensities of respective electromagnetic waves and/or wave bands in a predetermined wavelength range. For example, the predetermined wavelength range may include a portion of or all visible light range.

The spectroscopic result measured by the spectroscope 220 may be provided to the controller 230. The controller 230 may control the plasma process executed in the chamber 50, using the measured spectroscopic result.

In some embodiments, the controller 230 may control the process variables of the plasma process performed in the chamber 50 when it determines that an abnormality (e.g., a condition out of specification) has occurred in the plasma process by the measurement result. The process variables controlled by the controller 230 may include, for example, but are not limited to, an impedance of a connected impedance matching circuit included in the RF power supply 40, a gas pressure of a chamber 50 controlled by a gas discharged to the discharge port 60, an amount of process gas provided to the gas supply port 30, a temperature in the chamber 50, and the like. For example, the gas pressure of the chamber 50 may be controlled by the amount of gas in the chamber 50 which may be controlled by supply and/or discharge of the gas through the gas supply port 30 and/or the discharge port 60.

Figure 2:
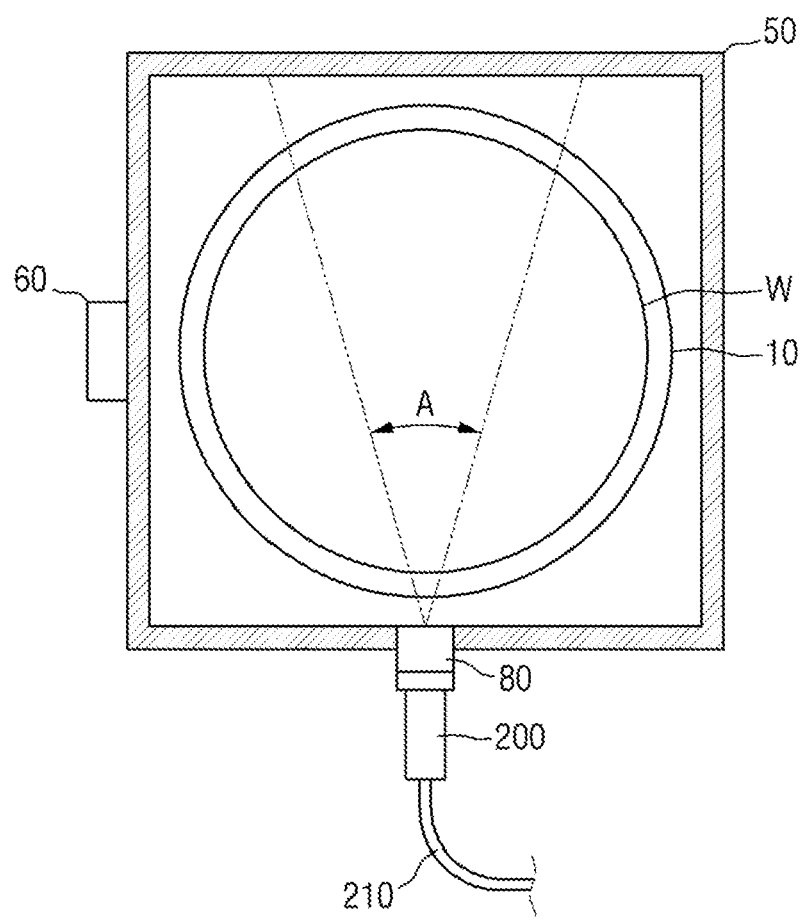
FIG. 2 is a plan view of a plasma processing apparatus having an OES device showing an operation of the OES device.

FIG. 2 is a plan view of a general plasma processing apparatus including an OES device.

Referring to FIG. 2, the OES device receives the plasma light generated from the chamber 50 through the viewport 80. The light-receiving part 200 is directly connected to the viewport 80, and the plasma light measured by the light-receiving part 200 is provided to the spectroscope 220 via the optical cable 210. For example, the plasma light may be electromagnetic waves generated from the plasma within the chamber 50. For example, the electromagnetic waves generated from the plasma may include visible light and/or electromagnetic waves outside visible light. For example, the electromagnetic waves generated from the plasma may be generated by electron transitions from higher energy levels to lower energy levels.

A range A of the incident angle of the plasma light that can be accommodated by the viewport 80 and the light-receiving part 200 is limited to about 30 to 40°. As illustrated in FIG. 2, the upper surface of the wafer W which can be covered by the range A of the incident angle of the plasma light occupies only a part of the area of the wafer W. Therefore, the range A of the incident angle of the plasma light may be somewhat insufficient for determining the presence or absence of abnormality (or out of specification) of the plasma light in the chamber 50 through measurement of the uniformity of the plasma light in the chamber 50. For example, when the viewport 80 and the light-receiving part 200 are fixed with respect to the chamber 50, the range A from which the light-receiving part 200 receives light generated from the plasma in the chamber 50 overlaps limited portion of the wafer W, e.g., 50% or less of the whole area of the wafer W in a plan view.

The OES device according to some embodiments of the present disclosure may expand the range of the incident angle of the plasma light which can be accommodated by the viewport 80 and the light-receiving part, by utilizing the rotation module (100 of FIG. 1). A detailed description thereof will be provided later.

Figure 3A:
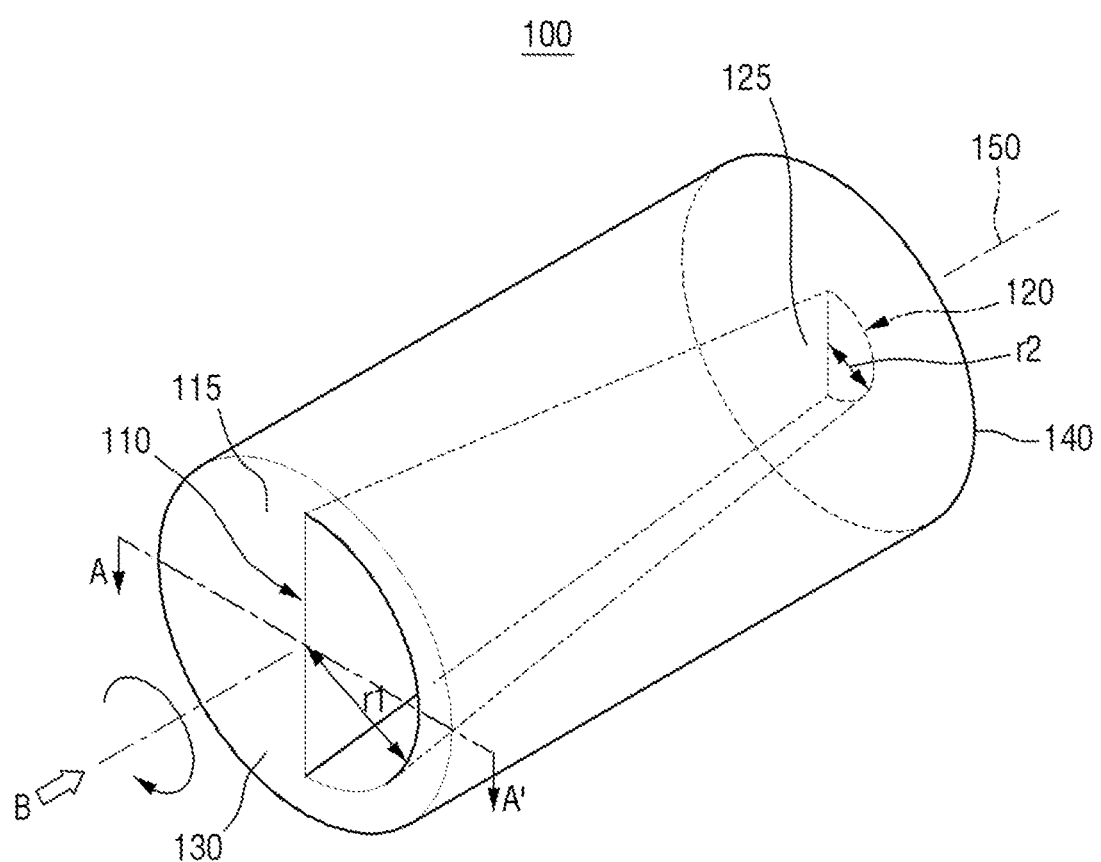
FIG. 3a is a perspective view of a rotation module included in an OES device according to some embodiments of the present disclosure.
Figure 3B:
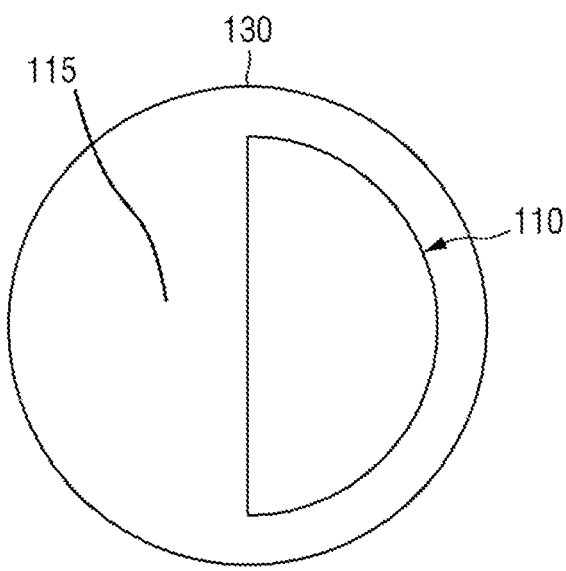

FIG. 3*a* is a perspective view of a rotation module according to some embodiments of the present disclosure, and FIG. 3*b* is a top view illustrating the rotation module of FIG. 3*a* seen from the B direction indicated in FIG. 3*a*.

Referring to FIGS. 3*a* and 3*b*, the rotation module 100 may include a first surface 130, a first opening 110 formed on the first surface 130, a second surface 140, and a second opening 120 formed on the second surface 140.

The rotation module 100 may have a cylindrical shape. For example, the rotation module 100 may have a first surface 130 which is a circular upper surface, and a second surface 140 which is a circular lower surface.

The first surface 130 of the rotation module 100 is a surface facing the viewport 80, and the second surface 140 of the rotation module 100 is a surface facing the light-receiving part 200.

For example, the first surface 130 may be brought into contact with the viewport 80 when the rotation module 100 and the viewport 80 are coupled, and the second surface 140 may be brought into contact with the light-receiving part 200 when the rotation module 100 and the light-receiving part 200 are coupled. However, the present disclosure is not limited thereto, and when the rotation module 100 and the viewport 80 are coupled through another coupling module, the first surface 130 and the viewport 80 may not be brought into contact with each other. Likewise, when the rotation module 100 and the light-receiving part 200 are coupled through another coupling module, the second surface 140 and the light-receiving part 200 may not be brought into contact with each other.

The rotation module 100 may be coupled to the viewport 80 so as to be rotatable about the rotation axis 150. The rotation axis 150 may pass through a center (e.g., the center of gravity or a geometric center) of the rotation module 100 in the B direction.

In FIGS. 3*a* and 3*b*, the first opening 110 may be formed on the first surface 130 to have a semicircular shape. For example, the first opening 110 may be a remaining part of the first surface 130 except the portion blocked by a first blocking film 115 having another semicircular shape on the first surface 130 having a circular shape. However, the shape of the first opening 110 is not limited to a semicircle, and the shape of the first opening 110 may vary depending on a portion on the first surface 130 blocked by the first blocking film 115. The first opening 110 may expose the inside of the rotation module 100 by the first blocking film 115. Though a blocking film is described, other types of blockers may be used so that the first opening 110 is configured to block part of the light from the chamber 50. For example, the blockers may block a part of plasma light coming from the chamber 50.

The second opening 120 may be formed on the second surface 140 to have a semicircular shape. For example, the second opening 120 may be a remaining portion of the second surface 140 except the portion blocked by the second blocking film 125 having another semicircular shape in the second surface 140 having a circular shape. The second opening 120 may be connected to the first opening 110, e.g., in light communication with the first opening 110, through an inner portion of the cylindrical shape of the rotation module 100. The second opening 120 may be formed in the same shape as the first opening 110. Therefore, when the first opening 110 is a semicircle, the second opening 120 may also be formed in a semicircular shape. For example, the first opening 110 and the second opening 120 may be similar and may have similarities, e.g., in a plan view. For example, a plan view shape of the second opening 120 may be obtained from a plan view shape of the first opening 110 by uniformly scaling (enlarging or reducing) the first opening 110.

A first radius r1 of the first opening 110 and a second radius r2 of the second opening 120 may be different from each other. For example, the first radius r1 of the first opening 110 may be larger than the second radius r2 of the second opening 120. The first radius r1 of the first opening 110 may correspond to the size of a window formed in the viewport 80, and the second radius r2 of the second opening 120 may correspond to the size of the opposing surface of the light-receiving part 200.

Figure 4A:
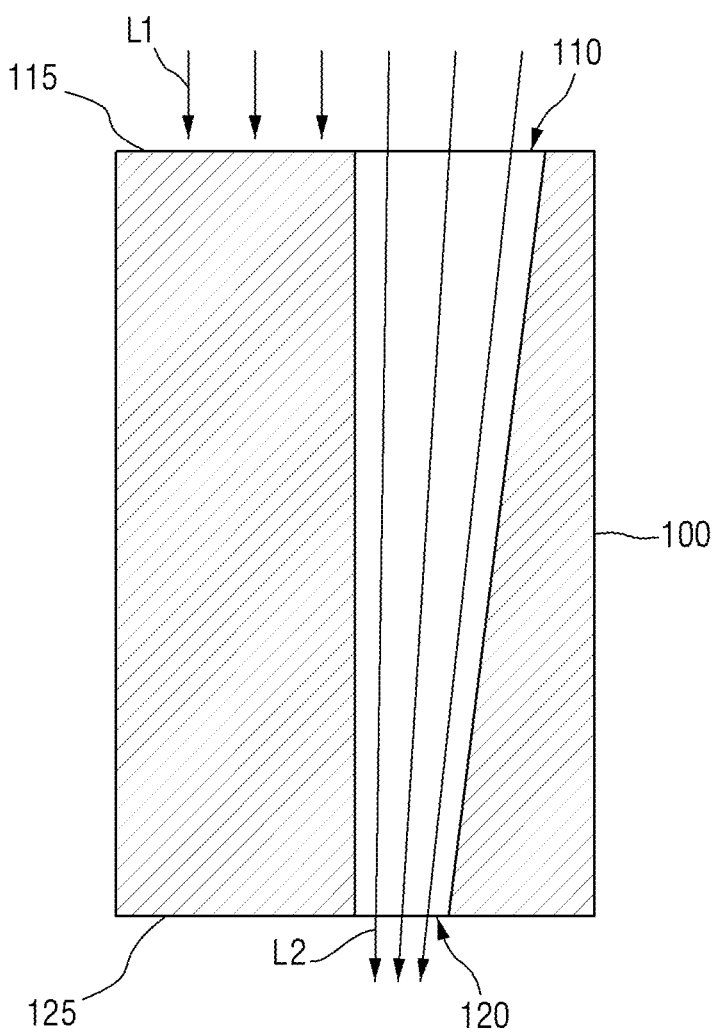

FIG. 4*a* is a cross-sectional view taken along line A-A' of the rotation module of FIG. 3*a*.

Referring to FIG. 4a, a state in which the plasma light generated inside the chamber 50 and passing through the viewport (80 of FIG. 1) is incident on the rotation module 100 is illustrated.

As described above, the first blocking film 115 may be formed on the first surface 130 of the rotation module 100, thereby blocking a part of the plasma light L1 incident on the first surface 130. A part L2 of the plasma light having passed through the first opening 110 passes through the rotation module 100 and exits from the second opening 120. The plasma light L2 exiting from the second opening 120 is provided to the light-receiving part 200.

Figure 4B:
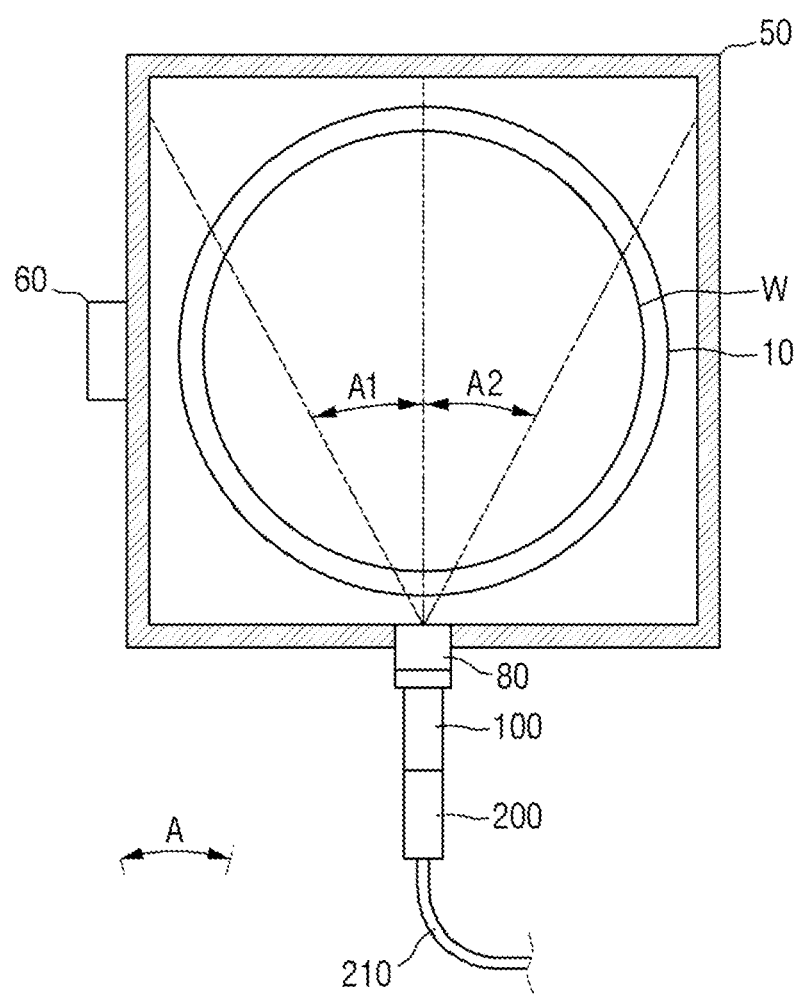
FIG. 4b is a plan view a plasma processing apparatus including an OES device according to some embodiments of the present disclosure.

Referring to FIG. 4b, a first area A1 blocked by the blocking film 115 in the chamber 50 and a second area A2 in which plasma light can be detected by the OES device are dividedly indicated. For example, plasma light coming from the first area A1 may be blocked by the blocking film 115 of FIG. 4a, and plasma light coming from the second area A2 may be incident through the rotation module 100 of FIG. 4a. Here, in FIG. 4b, a left area of the chamber is defined as the first area A1, and a right area of the chamber 50 is defined as the second area A2.

For example, even though the range of the incident angle of the plasma light that can be accommodated by the viewport 80 and the light-receiving part 200 may be still limited to 30 to 40°, the plasma light coming from area A2 may be detected while the plasma light coming from area A1 in the chamber 50 is blocked by the blocking film 115. While the structures and functions of the rotation module 110 are described above, the invention is not limited to the above described structures and/or the functions. For example, the rotation module 110 may be other types of rotation module capable of detecting plasma light coming from different areas of the chamber 50. In certain embodiments, the plasma processing apparatus may include a module other than the rotation module 110, e.g., a sweeping module or a scanning module which are capable of detecting different portions/areas of the chamber 50.

The determination of the uniformity of the plasma P in the chamber 50 may include detection of the plasma light coming from the first area A1 and the second area A2, and comparison of uniformity (or states/characteristics) of the plasma P between both areas. Hereinafter, determination of the uniformity of the plasma P in the chamber 50 will be described.

FIGS. 5a to 5d are plan views of the rotation module 100 and illustrate an operation of the rotation module according to some embodiments of the present disclosure.

Figure 5A:
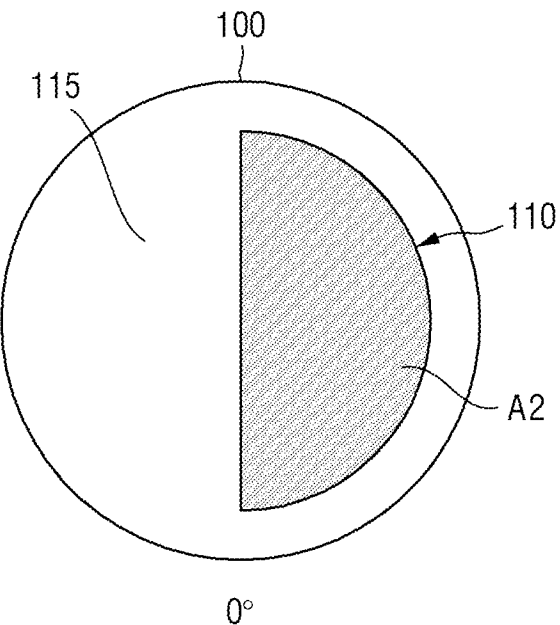
FIGS. 5a to 5d are diagrams of a rotation module included in an OES device according to some embodiments of the present disclosure.

First, referring to FIG. 5a, the plasma light coming from the chamber 50 is monitored when the rotation module 100 is positioned at 0°, e.g., a datum point as illustrated in FIG. 5a. As described with respect to FIGS. 4a and 4b, when the rotation module 100 is positioned at 0°, plasma light coming from the first area A1 is blocked by the blocking film 115, and plasma light coming from the second area A2 may be transferred through the first opening 110 to the light-receiving part 200 and may be detected and/or monitored by the light-receiving part 200.

Figure 5B:
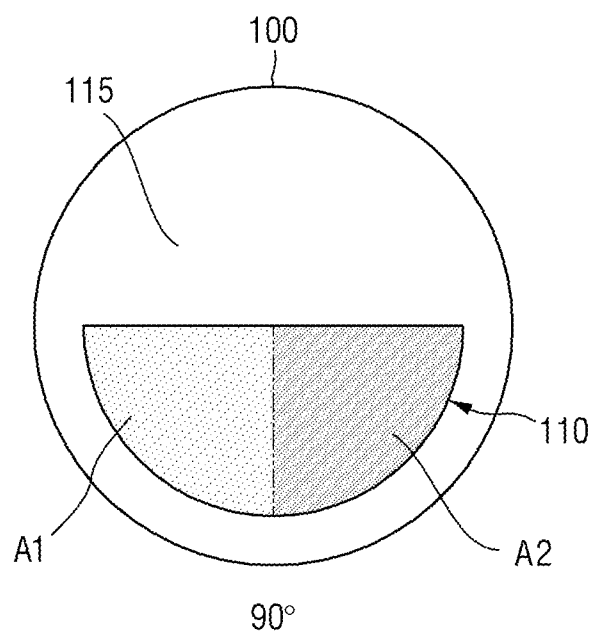

Referring to FIG. 5b, the plasma light coming from the chamber 50 is monitored when the rotation module 100 rotated by 90° (or positioned at 90°) with respect to the datum point. When the rotation module 100 rotates by 90° (or positions at 90°) with respect to the datum point as shown in FIG. 5b, the plasma light coming from the upper end portion of the chamber 50 is blocked by the blocking film 115, and monitoring of plasma light coming from the lower end portion of the chamber 50 may be performed with the plasma light coming through the first opening 110. For example, a part of the first area A1 and a part of the second area A2 of the chamber 50 may be simultaneously monitored with the plasma light coming through the first opening 110.

Figure 5C:
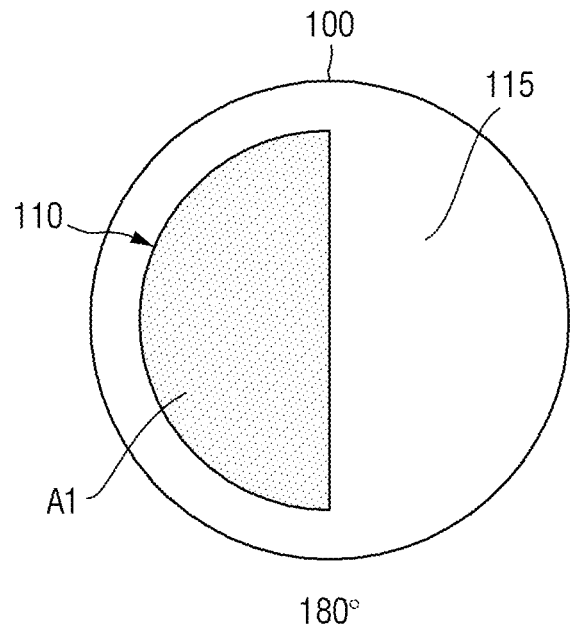

Next, referring to FIG. 5c, the plasma light coming from the chamber 50 may be transferred through the rotation module 100 rotated by 180° (or positioned at 180°) with respect to the datum point and may be detected and/or monitored by the light-receiving part 200. When the rotation module 100 rotates by 180° (or positions at 180°) with respect to the datum point as shown in FIG. 5c, plasma light coming from the second area A2 is blocked by the blocking film 115 and the first area A1 may be monitored with plasma light coming through the first opening 110.

Figure 5D:
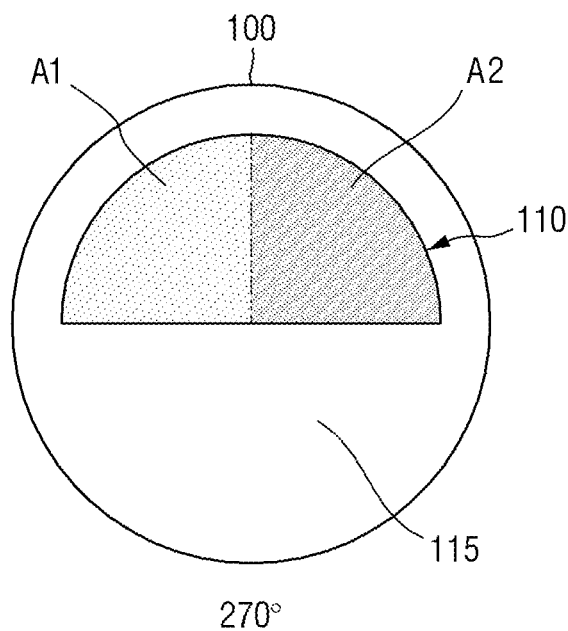

Subsequently, referring to FIG. 5d, the plasma light coming from the chamber 50 may be transferred through the rotation module 100 rotated by 270° (or positioned at 270°) with respect to the datum point and may be detected and/or monitored by the light-receiving part 200. When the rotation module 100 rotates by 270° (or positions at 270°) with respect to the datum point as shown in FIG. 5d, the plasma light coming from the lower end portion of the chamber 50 is blocked by the blocking film 115, and monitoring of the plasma light coming from the upper end portion of the chamber 50 may be performed with plasma light coming through the first opening 110. For example, a part of the first area A1 and a part of the second area A2 of the chamber 50 may be simultaneously monitored with plasma light coming through the first opening 110.

In order to determine the uniformity of the plasma P in the first area A1 and the second area A2 in the chamber 50, the plasm light coming through the first opening 110 when the rotation module 100 rotates by a first angle from the datum point may be compared with the plasma light coming through the first opening 110 when the rotation module 100 rotates by a second angle from the datum point. In some embodiments of the disclosure, the first angle may be 0° and the second angle may be 180°. For example, the plasma light coming through the first opening 110 when the rotation module 100 is positioned at the first angle from the datum point may come from different part of the plasma than the part of the plasma from which the plasma light coming through the first opening 110 when the rotation module 100 is positioned at the second angle from the datum point.

When the monitoring results of the plasma light with the rotation module 100 positions at the first angle and the second angle are different from each other, it may be determined that an abnormality (or a condition out of specification) has occurred in the plasma uniformity in the chamber 50. The determination of the uniformity of the plasma in the chamber 50 may be performed in real time, without interrupting the plasma process in the chamber 50.

Figure 6:
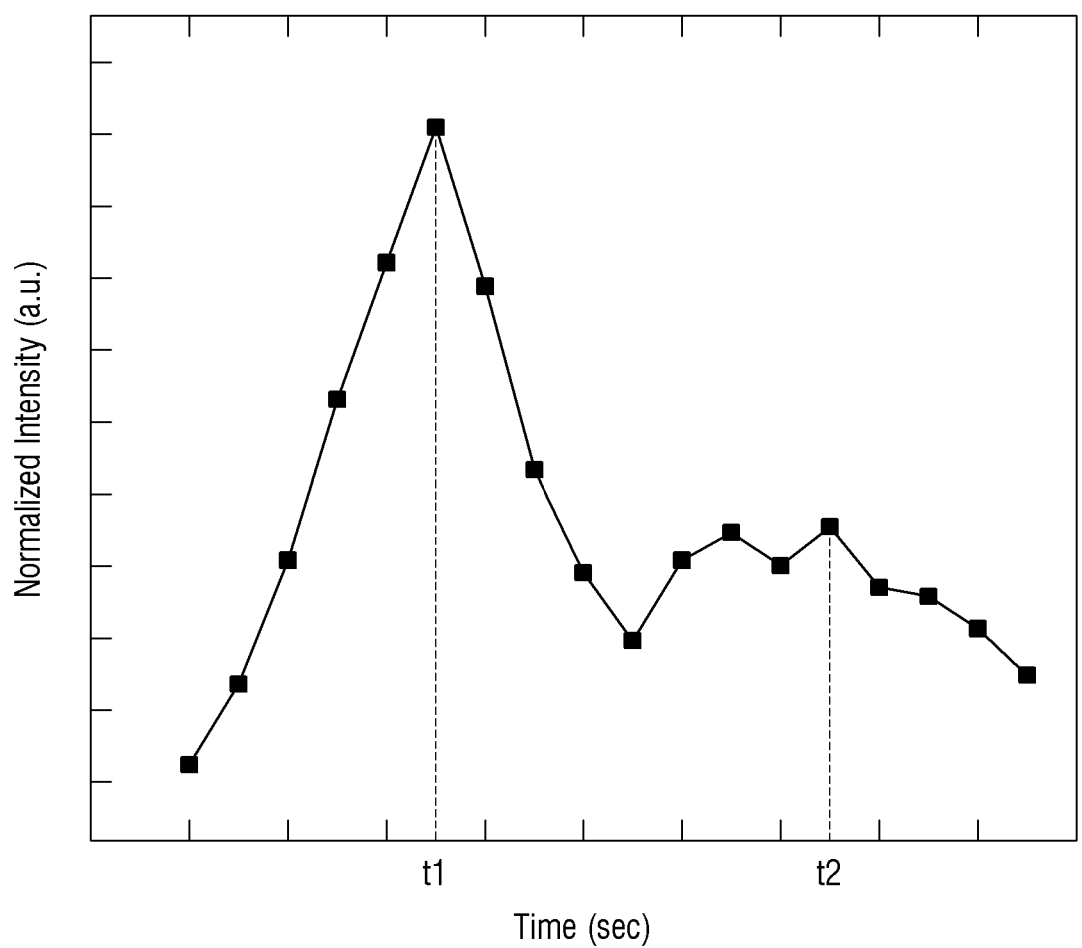
FIG. 6 is a graph of light intensity spectroscopic analysis obtained by operation of an OES device according to some embodiments of the present disclosure.

FIG. 6 is a graph of light intensity spectroscopic analysis obtained by operation of the rotation module and the OES device according to some embodiments of the present disclosure.

Referring to FIG. 6, the graph shows normalized intensities of the plasma light transferred through the first opening 110 while the rotation module 100 rotates. The intensity of the plasma light at the time t1 is a case monitored when the rotation module 100 rotates by the first angle from the datum point, and the intensity of the plasma light at the time t2 is a case monitored when the rotation module 100 rotates by the second angle from the datum point.

As illustrated in FIG. 6, when the intensities of the plasma light at the time t1 and t2 appear different (e.g., by a certain value or percentage of intensity) from each other, it may be determined that abnormality (or a condition out of specification) has occurred in the plasma uniformity in the chamber 50.

If it is determined that abnormality (or a condition out of specification) has occurred in the uniformity of the chamber 50, the plasma process in the chamber 50 may be interrupted, and process variables of the plasma process may be adjusted. For example, after the impedance of a connected impedance matching circuit included in the RF power supply 40, the gas pressure of the chamber 50 controlled by the gas discharged through the discharge port 60, the amount of process gas provided to the gas supply port 30, the temperature in the chamber 50 and the like are adjusted, the plasma process performed in the chamber 50 may be resumed with the adjusted process variables.

Figure 7:
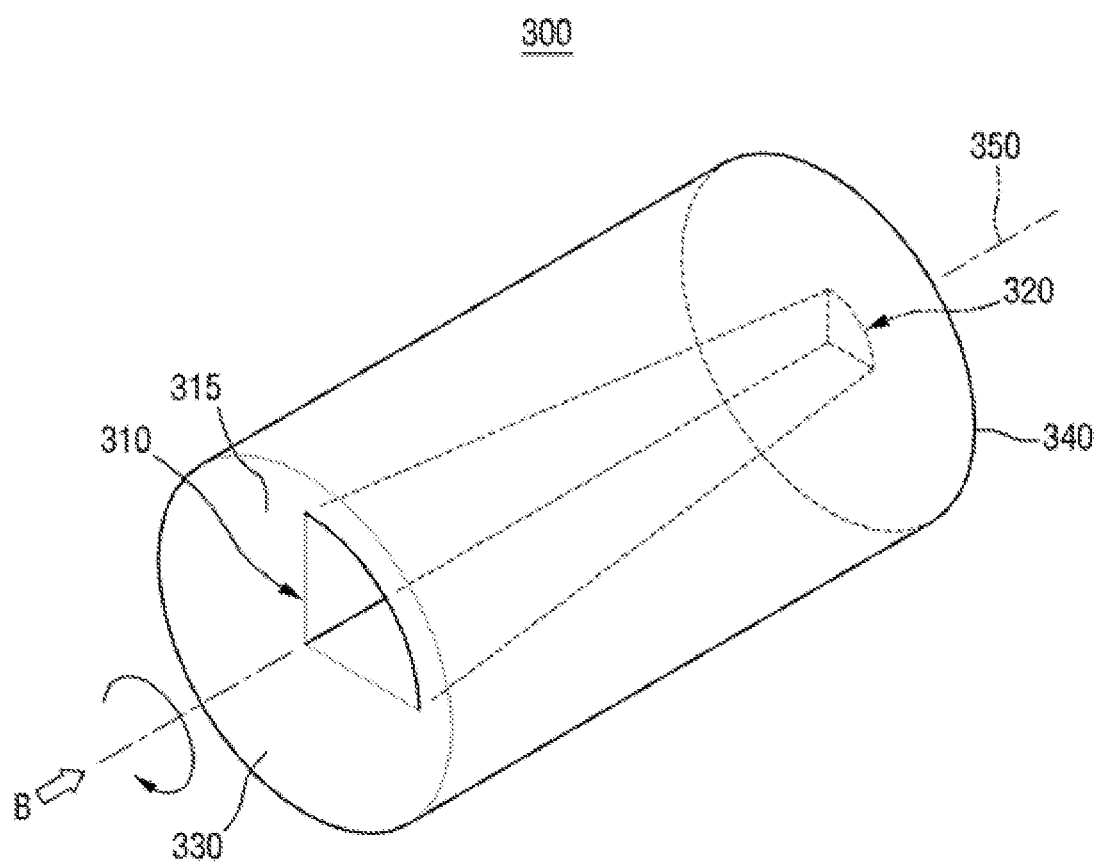
FIG. 7 is a perspective view of a rotation module included in an OES device according to some embodiments of the present disclosure.

FIG. 7 is a perspective view of a rotation module according to some embodiments of the present disclosure.

Referring to FIG. 7, the rotation module 300 may include a first surface 330, a first opening 310 formed in the first surface 330, a second surface 340, and a second opening 320 formed on the second surface 340.

The rotation module 300 illustrated in FIG. 7 differs from the rotation module 100 illustrated in FIG. 3a in that the shapes of the first opening 310 and the second opening 320 formed in the rotation module 300 are different from those of the first opening 110 and the second opening 120 illustrated in FIG. 3a.

The shapes of the first opening 310 and the second opening 320 may have a quadrant shape. For example, the blocking film 315 disposed on the first surface 330 may block ¾ of the first surface 330 and may open the rest as the first opening 310. For example, the blocking film 315 may cover about ¾ of the rotation module 300 in a plan view. For example, the blocking film 315 may have an open area of one quadrant of the first surface 330 in a plan view. Similarly, the blocking film of the second surface 340 may also block ¾ of the second surface 340 and may open the rest as the second opening 320. For example, the blocking film disposed on the second surface 340 may have an open area of one quadrant of the second surface 340 in a plan view.

FIGS. 8a to 8d are plan views of the rotation module 300 of FIG. 7 and illustrate an operation of the rotation module 300 according to some embodiments of the present disclosure.

Figure 8A:
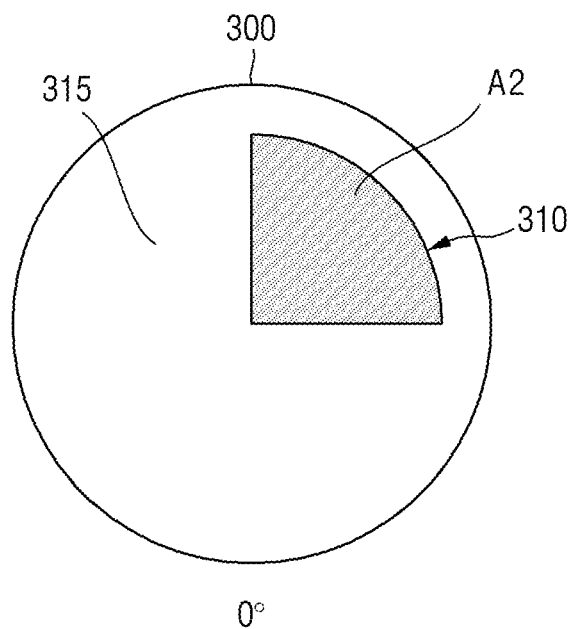
FIGS. 8a to 8d are diagrams of a rotation module included in an OES device and illustrate an operation of the rotation module according to some embodiments of the present disclosure.

Referring to FIG. 8a, the plasma light coming from the chamber 50 is monitored when the rotation module 300 is positioned at 0°, e.g., a datum point. When the rotation module 300 is positioned at 0°, the plasma light coming from a part of the second area A2 and the whole first area A1 may be blocked by the blocking film 315, and the plasma light coming from another part of the second area A2 may be transferred through the first opening 310 and may be detected/monitored by the light-receiving part 200. Here, the latter part of the second area A2 may correspond to the upper part of the second area A2.

Figure 8B:
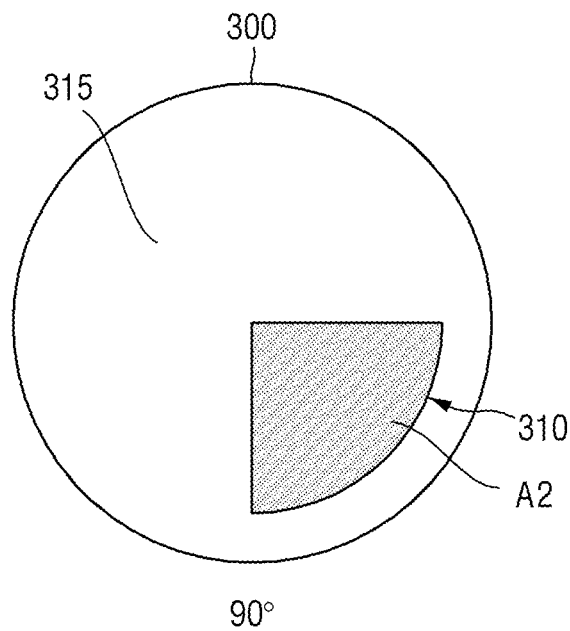

Next, referring to FIG. 8b, the plasma light coming from the chamber 50 is monitored when the rotation module 300 rotated by (or positioned at) 90° from the datum point. When the rotation module 300 rotates by (or positons at) 90° from the datum point, plasma light coming from a part of the second area A2 and the first area A1 are blocked by the blocking film 315, and plasma light coming from another part of the second area A2 may be transferred through the first opening 310 and may be detected/monitored by the light-receiving part 200. Here, the latter part of the second area A2 may correspond to the lower part of the second area A2.

Figure 8C:
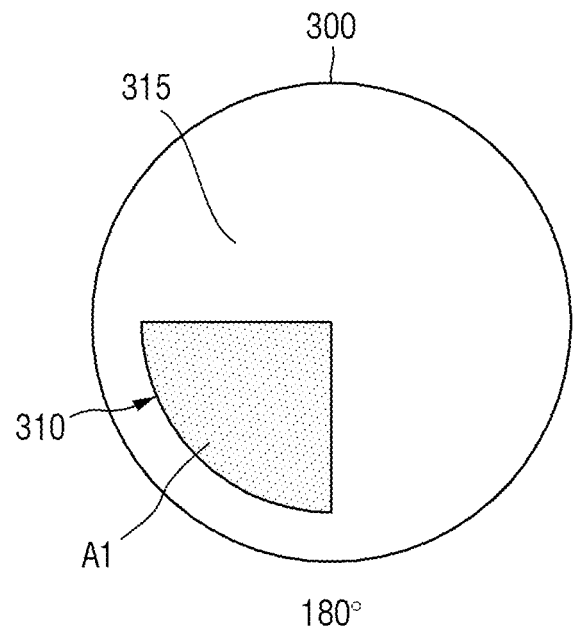

Next, referring to FIG. 8c, the plasma light coming from the chamber 50 is monitored when the rotation module 300 rotated by (or positioned at) 180° from the datum point. When the rotation module 300 rotates by (or positions at) 180° from the datum point, plasma light coming from a part of the first area A1 and the whole second area A2 may be blocked by the blocking film 315, and plasma light coming from another part of the first area A1 may be transferred through the first opening 310 and may be detected/monitored by the light-receiving part 200. Here, the latter part of the first area A1 may correspond to the lower part of the first area A1.

Figure 8D:
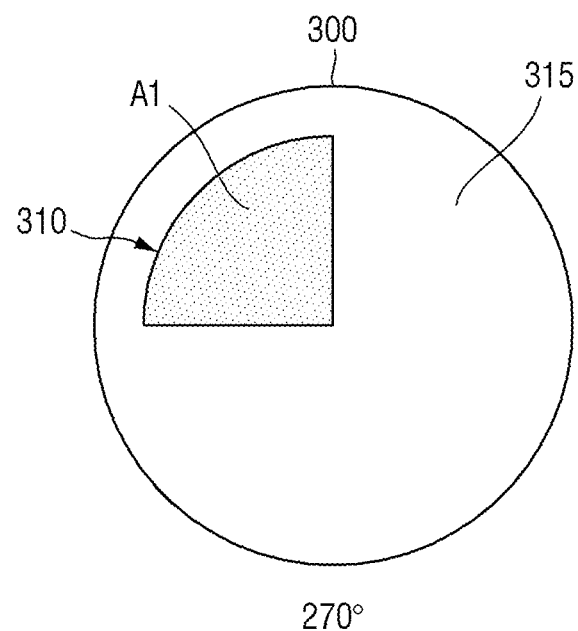

Subsequently, referring to FIG. 8d, the plasma light coming from the chamber 50 is monitored when the rotation module 300 rotated by (or positioned at) 270° from the datum point. When the rotation module 300 rotates by (or positions at) 270° from the datum point, plasma light coming from a part of the first area A1 and the whole second area A2 may be blocked by the blocking film 315, and plasma light coming from another part of the first area A1 may be transferred through the first opening 310 and may be detected/monitored by the light-receiving part 200. Here, the latter part of the first area A1 may correspond to the upper part of the first area A1. For example, the former part of the first area A1 and the upper part of the first area A1 may compose the whole first area A. For example, the first area A1 may be a half of the whole area for which the OES device monitors plasma P in the chamber 20. For example, the second area A2 may be the other half of the whole area for which the OES device monitors plasma P in the chamber 20.

In order to determine the uniformity of the plasma P in the first area A1 and the second area A2 inside the chamber 50, the plasma light monitored by the OES device when the rotation module 300 rotates by a first angle may be compared with the plasma light monitored by the OES device when the rotation module 300 rotates by a second angle. In some embodiments of the present disclosure, the first angle may be 0° and the second angle may be 270°.

At this time, when comparing the plasma light transferred through the first opening 310 when the rotation module 300 rotates by 0° and 270° with respect to a datum point, plasma states of the upper part of the first area A1 and the upper part of the second area A2 may be monitored.

In certain embodiments, the plasma light transferred through the first opening 310 when the rotation module 300 rotates by a third angle may be compared with the plasma light transferred through the first opening 310 when the rotation module 300 rotates by a fourth angle. In some embodiments of the present disclosure, the third angle may be 90° and the fourth angle may be 180° from the datum point.

When comparing the plasma lights coming through the first opening 310 when the rotation module 300 rotates by 90° and 180° respectively with respect to the datum point, the plasma states of the lower part of the first area A1 and the lower part of the second area A2 may be monitored.

For example, in the case of the OES device described through this embodiment, the uniformity of the plasma in the chamber 50 may be monitored by dividing the chamber 50 into the upper part and the lower part of the chamber 50. While a plasma process is performed in the chamber 50, the upper part of the chamber 50 close to the shower head 20 functioning as an upper electrode, and the lower part of the chamber 50 close to the electrostatic chuck 10 functioning as a lower electrode may have plasma states different from each other. Therefore, in order to determine the uniformity and/or states of the plasma, the monitoring of the plasma may be performed by dividing the upper part and the lower part of the chamber 50, the uniformity and/or states of the plasma in the monitored chamber 50 may be determined accordingly.

FIG. 9 is a flowchart illustrating a method of fabricating a semiconductor device performed by the plasma processing apparatus according to some embodiments of the present disclosure.

Referring to FIG. 9, the method of fabricating the semiconductor device performed by the plasma processing apparatus according to some embodiments of the present disclosure may include a step of inputting the wafer W into the chamber 50 in which the OES device is connected to the viewport 80 via the rotation module 100 (S110); a step of injecting a process gas into the chamber 50 and applying RF power to generate a plasma P (S120); a step of detecting plasma light through the EOS device in a state in which the rotation module 100 rotates by a first angle (S130); a step of detecting the plasma light through the EOS device in a state in which the rotation module rotates by the second angle (S140); a step of comparing the detection results of the plasma light at the first angle and the second angle (S150); a step of determining whether abnormality (or a condition out of specification) occurs in the plasma light (S160); and a step of adjusting process variables of the plasma process when there is abnormality (or a condition out of specification) (S170).

After uniformity of the plasma light is inspected via the OES device, uniformity inspection of the plasma light may be performed again through the OES device, while continuously performing the plasma process on different wafers W.

The foregoing is illustrative of example embodiments and is not to be construed as limiting thereof. Although a few example embodiments have been described, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A plasma processing apparatus comprising:
   a chamber configured to perform a plasma process on a wafer;
   a viewport configured to transmit plasma light generated in the chamber;
   a rotation module coupled to the viewport to be rotatable around a rotation axis; and
   an OES (Optical Emission Spectroscopy) device which is coupled to the rotation module and configured to receive the plasma light,
   wherein the rotation module includes a first surface facing the viewport and a second surface facing the OES device,
   wherein the first surface is configured to block a part of the plasma light, and includes a first opening through which an inside of the rotation module is configured to be exposed to a part of the plasma light, and
   wherein the second surface includes a second opening configured to be in optical communication with the first opening.

2. The plasma processing apparatus of claim 1, wherein the rotation module is configured to be positioned at a first angle to transmit a part of the plasma light coming from the chamber to the first opening, and
   wherein the rotation module is configured to rotate by a second angle to transmit a different part of the plasma light coming from the chamber to the first opening.

3. The plasma processing apparatus of claim 2, wherein the first opening has a semicircular shape.

4. The plasma processing apparatus of claim 2, wherein the first angle corresponds to a datum point and the second angle is 180 degrees from the datum point.

5. The plasma processing apparatus of claim 2, wherein the rotation module is configured to be positioned at the first angle to transfer plasma light coming from a first area of the chamber, and
   the rotation module is configured to rotate by the second angle to transfer plasma light coming from a second area of the chamber, the second area is different from the first area, each of the first and second areas compose a half of the chamber which is monitored by the OES device.

6. The plasma processing apparatus of claim 5, wherein the OES device is configured to monitor the plasma light coming from the first area, and
   wherein the OES device is configured to compare the plasma light coming from the second area to the plasma light coming from the first area to determine a plasma uniformity in the chamber.

7. The plasma processing apparatus of claim 2, wherein the first opening has a quadrant shape.

8. The plasma processing apparatus of claim 7, wherein the rotation module is configured to rotate by a third angle to transmit a part of the plasma light coming from the chamber through the first opening, and
   the rotation module is configured to rotate by a fourth angle to transmit a part of the plasma light coming from the chamber through the first opening.

9. The plasma processing apparatus of claim 8, wherein the first angle corresponds to a datum point, the second angle is 90 degrees from the datum point, the third angle is 180 degrees from the datum point, and the fourth angle is 270 degrees from the datum point.

10. The plasma processing apparatus of claim 8, wherein the OES device is configured to monitor the plasma light coming from the chamber by rotating the rotation module by the first, second, third and fourth angles,
    wherein the OES device is configured to compare the plasma light coming through the rotation module in the first and fourth angles to determine a plasma uniformity of an upper part of the chamber, and
    wherein the OES device is configured to compare the plasma light coming through the rotation module in the second and third angles to determine a plasma uniformity of a lower part of the chamber.

11. The plasma processing apparatus of claim 1, wherein a radius of the first opening is different from a radius of the second opening.

12. The plasma processing apparatus of claim 11, wherein the radius of the first opening is larger than the radius of the second opening.

13. The plasma processing apparatus of claim 1, wherein the OES device comprises:
    a light-receiving part configured to receive the plasma light transmitted from the rotation module,
    a spectroscope configured to separate the plasma light to analyze intensity depending on wavelength; and
    an optical cable connecting the light-receiving part and the spectroscope.

14. An OES (Optical Emission Spectroscopy) device comprising:

a rotation module coupled to a viewport of a chamber, the rotation module configured to transmit plasma light generated in the chamber, the rotation module configured to be rotatable around a rotation axis;

a light-receiving part coupled to the rotation module and configured to receive the plasma light;

a spectroscope configured to separate the plasma light and analyze intensities of corresponding wavelengths; and an optical cable which connects the light-receiving part and the spectroscope, wherein the rotation module includes a first surface coupled to the viewport and a second surface coupled to the light-receiving part, wherein the first surface is configured to block a part of the plasma light, and includes a first opening through which an inside of the rotation module is configured to be exposed to a part of the plasma light, and wherein the second surface includes a second opening configured to be in optical communication with the first opening.

15. The OES device of claim 14, wherein the rotation module is configured to be positioned at a first angle to transmit a part of the plasma light coming from the chamber to the first opening, and the rotation module is configured to rotate by a second angle to transmit a part of the plasma light coming from the chamber to the first opening.

16. The OES device of claim 15, wherein the first opening has a semicircular shape.

17. The OES device of claim 15, wherein the rotation module is configured to be positioned at the first angle to monitor the plasma light coming from a first area of the chamber, and wherein the rotation module is configured to rotate by the second angle to monitor the plasma light coming from a second area of the chamber.

18. The OES device of claim 17, wherein the OES device is configured to compare the plasma light of the first area and the plasma light of the second area monitored by the OES device with each other to determine a plasma uniformity in the chamber.

* * * * *